(12) United States Patent
McLean et al.

(10) Patent No.: US 9,637,820 B2
(45) Date of Patent: May 2, 2017

(54) FLAME GUARD AND EXHAUST SYSTEM FOR LARGE AREA COMBUSTION DEPOSITION LINE, AND ASSOCIATED METHODS

(75) Inventors: David D. McLean, Hazel Park, MI (US); Ryan L. Dear, Huntertown, IN (US)

(73) Assignee: Guardian Industries Corp., Auburn Hills, MI (US)

( * ) Notice: Subject to any disclaimer, the term of this patent is extended or adjusted under 35 U.S.C. 154(b) by 1544 days.

(21) Appl. No.: 12/654,651

(22) Filed: Dec. 28, 2009

(65) Prior Publication Data

US 2011/0159198 A1  Jun. 30, 2011

(51) Int. Cl.
*C23C 16/453* (2006.01)
*C23C 16/54* (2006.01)

(52) U.S. Cl.
CPC .......... *C23C 16/453* (2013.01); *C23C 16/545* (2013.01); *Y10T 29/49826* (2015.01)

(58) Field of Classification Search
CPC .............................. C23C 16/453; C23C 16/545
USPC ....................................................... 118/326
See application file for complete search history.

(56) References Cited

U.S. PATENT DOCUMENTS

| | | | |
|---|---|---|---|
| 5,101,558 A | 4/1992 | Grob et al. | |
| 5,652,021 A | 7/1997 | Hunt et al. | |
| 5,858,465 A | 1/1999 | Hunt et al. | |
| 6,013,318 A | 1/2000 | Hunt et al. | |
| 6,056,824 A * | 5/2000 | Bartholomew et al. | 118/719 |
| 6,193,911 B1 | 2/2001 | Hunt et al. | |
| 6,626,997 B2 * | 9/2003 | Shapiro | 118/719 |
| 2005/0061036 A1 | 3/2005 | Mileo et al. | |

(Continued)

FOREIGN PATENT DOCUMENTS

| | | |
|---|---|---|
| DE | 78 517 | 1/1894 |
| EP | 1 602 633 | 12/2005 |

(Continued)

OTHER PUBLICATIONS

U.S. Appl. No. 11/979,543, filed Nov. 5, 2007; Remington.

(Continued)

*Primary Examiner* — Dah-Wei D Yuan
*Assistant Examiner* — Stephen Kitt
(74) *Attorney, Agent, or Firm* — Nixon & Vanderhye P.C.

(57) ABSTRACT

Certain example embodiments relate to an in-line scalable system that may be used in the combustion deposition depositing of thin films. The systems of certain example embodiments may comprise one or more modules, with each such module including at least one burner and at least one high volume cooling section. In certain example implementations, multiple burners and multiple cooling sections are provided to a single module in alternating order. The systems of certain example embodiments may, in addition or in the alternative, comprise a combined flame guard and exhaust system. The combined flame guard and exhaust system of certain example embodiments advantageously may provide a means to reduce the amount of interference of the deposition process by ambient conditions, improve flame uniformity in the deposition zone, contain and exhaust combustion products while reducing restrictions to the stable operating space of the combustion deposition process, etc.

17 Claims, 8 Drawing Sheets

(56) References Cited

U.S. PATENT DOCUMENTS

| | | |
|---|---|---|
| 2006/0003108 A1 | 1/2006 | Zobel et al. |
| 2006/0127599 A1* | 6/2006 | Wojak .......................... 427/569 |

FOREIGN PATENT DOCUMENTS

| | | |
|---|---|---|
| GB | 2 292 468 | 2/1996 |
| JP | 06 221525 | 8/1994 |
| JP | 09-286636 | 4/1997 |
| WO | 2004/005184 | 1/2004 |
| WO | WO 2004/056714 | 7/2004 |
| WO | 2004/103900 | 12/2004 |
| WO | 2005/087660 | 9/2005 |

OTHER PUBLICATIONS

U.S. Appl. No. 12/000,784, filed Dec. 17, 2007; Lewis et al.
U.S. Appl. No. 12/071,162, filed Feb. 15, 2008; Remington.
U.S. Appl. No. 12/076,101, filed Mar. 13, 2008; Lewis et al.
U.S. Appl. No. 12/076,100, filed Mar. 13, 2008; Remington, Jr.
U.S. Appl. No. 12/155,762, filed Jun. 9, 2008; McLean.
U.S. Appl. No. 12/591,168, filed Nov. 10, 2009; McLean.
U.S. Appl. No. 12/213,008, filed Jun. 12, 2009; Varaprasad et al.
U.S. Appl. No. 12/149,396, filed Apr. 30, 2008; Remington, Jr.
"Combustion Chemical Vapor Deposition: A Novel Thin-Film Deposition Technique", Hunt et al., 1993 American Institute of Physics, Apr. 21, 1993.
"Growth of Thin Films of Molybdenum and Tungsten Oxides by Combustion CVD using Aqueous Precursor Solutions", Davis et al., Chemical Vapor Deposition 2004, 10, No. 1, pp. 29-34.
"Specifications/Design Details" Radiant Energy—source and transfer, Rad/Max Burners Sep. 2002, pp. 1403-1414.
"Metal oxide powder synthesis by the emulsion combustion Method," Tani et al., J. Mater. Res., vol. 13, No. 5, May 1998, pp. 1099-1102.
"Morphology of Oxide Particles Made by the Emulsion Combustion Method," Tani et al., J. American Ceramic Society, 2003, vol. 86, No. 6, pp. 898-904.
"Dynamics of Hollow and Solid Alumina Particle Formation in Spray Flames," Tani et al., J. American Ceramic Society, 2004, vol. 87, No. 3, pp. 523-525.
"Criteria for Flame-Spray Synthesis of Hollow, Shell-Like, or Inhomogeneous Oxides," Jossen et al., J. American Ceramic Society, 2005, vol. 88, No. 6, pp. 1388-1393.
"Liquid-fed Aerosol Reactors for One-step Synthesis of Nano-structured Particles," Mädler, KONA No. 22, 2004, pp. 107-120.
"Flame aerosol synthesis of smart nanostructured materials," Strobel et al., J. Mater. Chem., 2007, 17, pp. 4743-4756.
U.S. Appl. No. 12/000,784, filed Dec. 17, 2007.
"Single-Molecule Precursor Chemistry for the Deposition of Chalcogenide (S or SE) containing Compound Semiconductors by MOCVD and Related Methods" O'Brien et al., J. Mater. Chem. 1995, pp. 1761-1773.
"Mechanisms of $SiO_2$ film deposition from tetramethylcyclotetrasiloxane, dimethyldimethoxysilane, and trimethylsilane plasmas" Zhang et al., J. Vac. Sci. Technol. A 22(1) Jan./Feb. 2004.
High-Temperature Chemistry of the Conversion of Siloxanes to Silicon Carbide, Burns et al., Chem. Mater. 1992.
"Preparation of Silicon Carbide from Organosilicon Gels: 1, Synthesis and Characterization of Precursor Gels", White et al., Advanced Ceramic Materials, vol. 2, No. 1, 1987.
"Preparation of Silicon Carbide from Organosilicon Gels: 11, Gel Pyrolysis and SiC Characterization", White et al., Advanced Ceramic Materials, vol. 2, No. 1 1987.
"Nitrogen-Containing $SiO_2$ Glass Fibers Prepared by Ammonolysis of Gels Made from Silicon Alkoxides", Kamiya et al., Journal of Non-Crystalline Solids 83, 1986.
"Organic and Inorganic Spin-On Polymers for Low-Dielectric-Constant Applications" Hacker, MRS Bulletin/Oct. 1997.
"Nanoporous Silica as an Ultralow-k Dielectric", Jin et al., MRS Bulletin/Oct. 1997.
"Phase-Separated Inorganic-Organic Hybrids for Microelectronic Applications", Miller et al., MRS Bulletin/Oct. 1997.
"Chemical Vapor Deposition of Cubic Gallium Sulfide Thin Films: A New Metastable Phase", MacInnes et al., 1992 American Chemical Society.
"Chemical Vapor Deposition of Gallium Sulfide: Phase Control by Molecular Design", MacInnes et al., 1993 American Chemical Society.
"Organometallic Polymers as Precursors to Ceramic Materials: Silicon Nitride and Silicon Oxynitride", Laine et al, Supplied by the British Library—"The World's Knowledge".
"Flame synthesis of calcium-, strontium-, barium fluoride nanoparticles and sodium chloride", Grass et al., Chem. Commun., 2005, pp. 1767-1769.
"Inorganic nanofluorides and related nanocomposites", Kuznetsov et al., Russian Chemical Reviews 75 (12) pp. 1065-1082 (2006).
"Comparison of Amorphous TCP Nanoparticles to Micron-Sized α-TCP as Starting Materials for Calcium Phosphate Cements", Brunner et al., Journal of Biomedical Materials Research Part B: Applied Biomaterials, 2007, pp. 400-407.
"Metal 2-ethylhexanoates and related compounds as useful precursors in materials science", Mishra et al., Chem. Soc. Rev., 2007, 36, pp. 1770-1787.
"Preparation of Homogeneous, Bulk Nanocrystalline Ni/Mo Alloys with Tripled Vickers Hardness Using Flame-Made Metal Nanoparticles", Athanassiou et al., Chem. Mater., vol. 19, No. 20, 2007, pp. 4847-4854.
"Covalently Functionalized Cobalt Nanoparticles as a Platform for Magnetic Separations in Organic Synthesis", Grass et al., Angew. Chem. Int. Ed. 2007, 46, pp. 4909-4912.
"Insulator coated metal nanoparticles with a core/shell geometry exhibit a temperature sensitivity similar to advanced spinels", Athanassiou et al., Sensors and Actuators A 138 (2007), pp. 120-129.
"Exposure of Engineered Nanoparticles to Human Lung Epithelial Cells: Influence of Chemical Composition and Catalytic Activity on Oxidative Stress", Limbach et al., Environmental Science & Technology, vol. 41, No. 11, 2007, pp. 4158-4163.
"Synthesis of barium fluoride nanoparticles by precipitation in ethanol-aqueous mixed solvents", Lv et al., Powder Technology 173 (2007); pp. 174-178.
"Large-scale preparation of ceria/bismuth metal-matrix nano-composites with a hardness comparable to steel", Grass et al., Journal of Materials Chemistry, 2007, 17, pp. 1485-1490.
"Grain growth resistance and increased hardness of bulk nanocrystalline fcc cobalt prepared by a bottom-up approach", Grass et al., Nanotechnology 18 (2007), pp. 1-7.
"Aerosol flame synthesis of catalysts", Strobel et al., Advanced Powder Technol., vol. 17, No. 5, pp. 457-480 (2006).
"Flame spray synthesis under a non-oxidizing atmosphere: Preparation of metallic bismuth nanoparticles and nanocrystalline bulk bismuth metal", Grass et al., Journal of Nanoparticle Research (2006) 8, pp. 729-736.
"Ambient Template-Directed Synthesis of Single-Crystalline Alkaline-Earth Metal Fluoride Nanowires", Mao et al., Advanced Materials, 2006, 18, pp. 1895-1899.
"Unprecedented formation of metastable monoclinic $BaCO_3$ nanoparticles", Strobel et al., Thermochimica Acta 445 (2006), pp. 23-26.
"Large-scale production of carbon-coated copper nanoparticles for sensor applications", Athanassiou et al., Institute of Physics Publishing, Nanotechnology 17 (2006), pp. 1668-1673.
"Gas phase synthesis of fcc-cobalt nanoparticles", Grass et al., Journal of Materials Chemistry, 2006, 16, pp. 1825-1830.
"Design of High-Temperature, Gas-Phase Synthesis of Hard or Soft $TiO_2$ Agglomerates", Grass et al., AIChE Journal, Apr. 2006, vol. 52, No. 4, pp. 1318-1325.
"Glass and bioglass nanopowders by flame synthesis", Brunner et al., Chem. Commun., 2006, pp. 1384-1386.

(56) References Cited

OTHER PUBLICATIONS

"In Vitro Cytotoxicity of Oxide Nanoparticles: Comparison to Asbestos, Silica, and the Effect of Particle Solubility", Brunner et al., Environmental Science & Technology, vol. 40, No. 14, 2006, pp. 4374-4381.
"Polyol-Mediated Synthesis of Nanoscale $CaF_2$ and $CaF_2$: Ce,Tb", Feldmann et al., Small 2006, 2, No. 11, pp. 1248-1250.

* cited by examiner

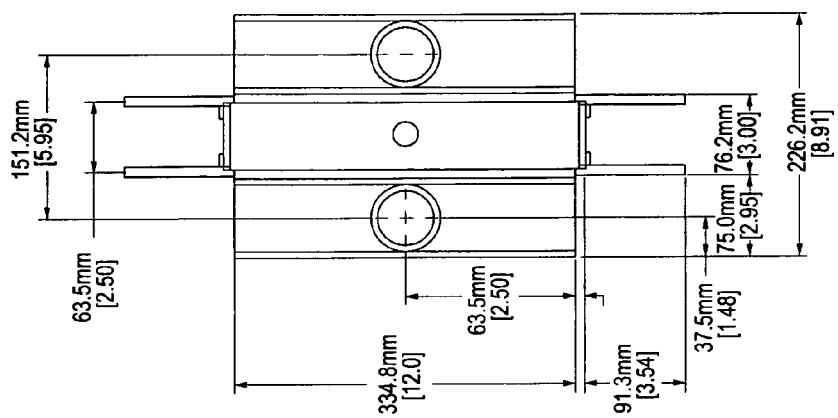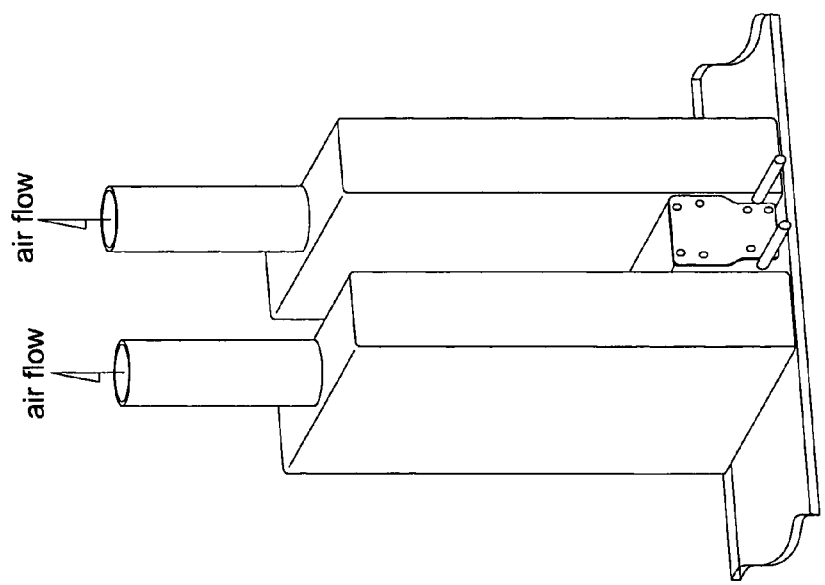
Fig. 9

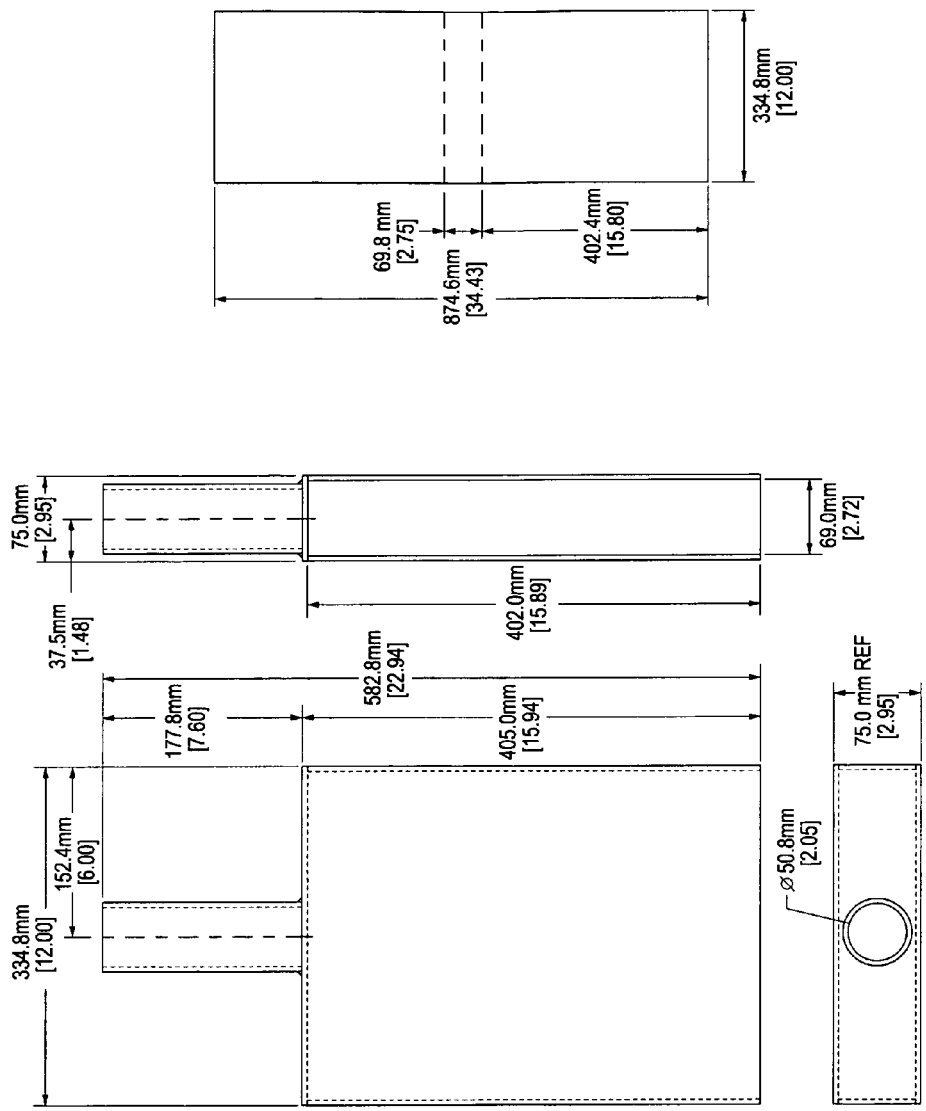
Fig. 10
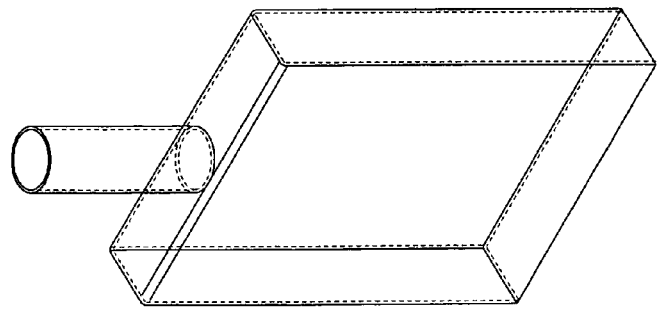

FLAME GUARD AND EXHAUST SYSTEM FOR LARGE AREA COMBUSTION DEPOSITION LINE, AND ASSOCIATED METHODS

FIELD OF THE INVENTION

Certain example embodiments of this invention relate to the deposition of thin film coatings onto substrates via combustion deposition. More particularly, certain example embodiments relate to an in-line scalable system that may be used in the combustion deposition depositing of thin films. The systems of certain example embodiments may comprise one or more modules, with each such module including at least one burner and at least one high volume cooling section. In certain example implementations where multiple burners and multiple cooling sections are provided to a single module, the burners and cooling sections may be provided in alternating order. The systems of certain example embodiments may, in addition or in the alternative, comprise a combined flame guard and exhaust system. The combined flame guard and exhaust system of certain example embodiments advantageously may provide a means to reduce the amount of interference of the deposition process by ambient conditions, improve flame uniformity in the deposition zone, contain and exhaust combustion products while reducing restrictions to the stable operating space of the combustion deposition process, etc.

BACKGROUND AND SUMMARY OF EXAMPLE EMBODIMENTS OF THE INVENTION

Reagent concentration, temperature, and residence time are known factors that drive chemical reactions. Combustion chemical vapor deposition (combustion CVD) processes are no different. The significance of these factors and their controlling process parameters has been well documented.

Combustion chemical vapor deposition (combustion CVD) is a relatively new technique for the growth-of coatings. Combustion CVD is described, for example, in U.S. Pat. Nos. 5,652,021; 5,858,465; and 6,013,318, each of which is hereby incorporated herein by reference in its entirety.

Conventionally, in combustion CVD, precursors are dissolved in a flammable solvent and the solution is delivered to the burner where it is ignited to give a flame. Such precursors may be vapor or liquid and fed to a self-sustaining flame or used as the fuel source. It will be appreciated that when used with a self-sustaining flame, a solvent may or may not be required. A substrate is then passed under the flame to deposit a coating.

There are several advantages of combustion CVD over traditional pyrolytic deposition techniques (such as CVD, spray and sol-gel, etc.). One advantage is that the energy required for the deposition is provided by the flame. A benefit of this feature is that the substrate typically does not need to be heated to temperatures required to activate the conversion of the precursor to the deposited material (e.g., a metal oxide). Because the energy needed for deposition is provided by the flame, the need for additional energy sources may be reduced and the technique may be amendable to temperature-sensitive substrates. Also, a curing step (typically required for spray and sol-gel techniques) typically is not required. Another advantage is that combustion CVD techniques do not necessarily require volatile precursors. If a solution of the precursor can be atomized/nebulized sufficiently (e.g., to produce droplets and/or particles of sufficiently small size), the atomized solution will behave essentially as a gas and can be transferred to the flame without requiring an appreciable vapor pressure from the precursor of interest. Still another advantage relates to the ability to operate combustion CVD apparatuses at atmospheric conditions, thereby reducing equipment costs compared to techniques that require a controlled environment.

Conventional combustion CVD processes involve passing a precursor material directly through the entire length of the flame by inserting it into the combustion gas stream prior to being combusted. In some conventional techniques, a precursor/solvent solution is used as the fuel source. The temperature and residence time profile experienced by the precursor is controlled by the combustion conditions and/or burner-to-substrate distance.

It will be appreciated that combustion deposition techniques may be used to deposit metal oxide coatings (e.g., single-layer anti-reflective coatings) on glass substrates, for example, to alter the optical properties of the glass substrates (e.g., to increase visible transmission). To this end, conventional combustion deposition techniques were used by the inventor of the instant application to deposit a single layer anti-reflective (AR) film of silicon oxide (e.g., $SiO_2$ or other suitable stoichiometry). The attempt sought to achieve an increase in light transmission in the visible spectrum (e.g., wavelengths of from about 400-700 nm) over clear float glass with an application of the film on one or both sides. The clear float glass used in connection with the description herein is a low-iron glass known as "Extra Clear," which has a visible transmission typically in the range of 90.3% to about 91.0%. Of course, the examples described herein are not limited to this particular type of glass, or any glass with this particular visible transmission.

The combustion deposition development work was performed using a conventional linear burner with 465 holes even distributed in 3 rows over an area of 0.5 cm by 31 cm (155 holes per row). By way of example and without limitation, FIG. 1a shows a typical linear burner, and FIG. 1b is an enlarged view of the holes in the typical linear burner of FIG. 1a. As is conventional, the linear burner was fueled by a premixed combustion gas comprising propane and air. It is, of course, possible to use other combustion gases such as, for example, natural gas, butane, etc. The standard operating window for the linear burner involves air flow rates of between about 150 and 300 standard liters per minute (SLM), using air-to-propane ratios of about 15 to 25. Successful coatings require controlling the burner-to-lite distance to between about 5-50 mm when a linear burner is used.

Typical process conditions for successful films used a burner air flow of about 225 SLM, an air-to-propane ratio of about 19, four passes of the substrate across the burner, a burner-to-lite distance of 35 mm, and a glass substrate velocity of about 50 mm/sec.

FIG. 2 is a simplified view of an apparatus 200 including a linear burner used to carry out combustion deposition. A combustion gas 202 (e.g., a propane air combustion gas) is fed into the apparatus 200, as is a suitable precursor 204 (e.g., via insertion mechanism 206, examples of which are discussed in greater detail below). Precursor nebulization (208) and at least partial precursor evaporation (210) occur within the apparatus 200. The precursor could also have been delivered as a vapor reducing or even eliminating the need for nebulization The flame 18 may be thought of as including multiple areas. Such areas correspond to chemical reaction area 212 (e.g., where reduction, oxidation, and/or the like may occur), nucleation area 214, coagulation area 216, and agglomeration area 218. Of course, it will be appreciated that such example areas are not discrete and that one or more of the above processes may begin, continue, and/or end throughout one or more of the other areas.

Particulate matter begins forming within the flame 18 and moves downward towards the surface 26 of the substrate 22 to be coated, resulting in film growth 220. As will be appreciated from FIG. 2, the combusted material comprises non-vaporized material (e.g., particulate matter), which is also at least partially in particulate form when coming into contact with the substrate 22. To deposit the coating, the substrate 22 may be moved (e.g., in the direction of the velocity vector). Of course, it will be appreciated that the present invention is not limited to any particular velocity vector, and that other example embodiments may involve the use of multiple apparatuses 200 for coating different portions of the substrate 22, may involve moving a single apparatus 200 while keeping the substrate in a fixed position, etc. The flame 18 is about 5-50 mm from the surface 26 of the substrate 22 to be coated.

As substrate sizes become larger and larger, it will be appreciated that it would be desirable to provide a combustion deposition apparatus that can accommodate large-area depositions. Furthermore, it will be appreciated that the development of a scalable combustion deposition apparatus also would be desirable.

In certain example embodiments of this invention, there is provided a flame guard and exhaust system for use in a combustion deposition depositing system for forming a coating on a substrate via at least one flame of at least one burner. An external baffle is provided. An internal baffle is spaced apart from the external baffle, with the internal baffle to be closer than the external baffle to the burner. An exhaust duct is located over the external and internal baffle, with these baffles comprising a portion of the duct. First and second walls are to be respectively provided at opposing ends of the burner and joining the external baffle to the internal baffle so as to complete the exhaust duct. The external baffle is sized and positioned to (1) reduce an amount of air flow into a deposition area proximate to the at least one flame during operation of the combustion deposition depositing system and (2) serve as an external wall of the exhaust duct. The internal baffle is sized and positioned to (1) at least partially confine the deposition area to the area immediately under the burner face during operation of the combustion deposition depositing system and (2) provide an internal wall of the exhaust duct.

In certain example embodiments of this invention, a combustion deposition apparatus for use in combustion deposition depositing a coating on a substrate is provided. A burner is configured to create a flame in an area between the burner and the substrate, with the burner being sized such that it extends at least along the entire length of the substrate. A plurality of flame guard and exhaust systems are provided, with each said flame guard and exhaust system comprising: an external baffle; an internal baffle spaced apart from the external baffle, with the internal baffle being closer than the external baffle to the burner; an exhaust duct located over the external and internal baffle; and first and second walls to be respectively provided at opposing ends of the burner and joining the external baffle to the internal baffle so as to complete the exhaust duct. The external baffle is sized and positioned to (1) reduce an amount of air flow into a deposition area proximate to the at least one flame during operation of the combustion deposition depositing system and (2) serve as an external wall of the exhaust duct, and the internal baffle is sized and positioned to (1) at least partially confine the deposition area to the area immediately under the burner face during operation of the combustion deposition depositing system and (2) provide an internal wall of the exhaust duct. In operation, the flame causes precursor material to be combusted and heats the substrate to allow at least a portion of the combusted precursor material to form the coating, directly or indirectly, on the substrate. The flame guard and exhaust systems are provided on opposing sides of the first burner.

In certain example embodiments of this invention, methods of making these and/or other similar flame guard and exhaust systems also are provided.

In certain example embodiments of this invention, methods of making coated articles also are provided. These and/or other similar combustion deposition modules or systems also are provided. The substrate to be coated is provided to the module. The flame is used to (1) combust precursor material and (2) heat the substrate to allow at least a portion of the combusted precursor material to form the coating, directly or indirectly, on the substrate.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which:

FIG. 1b is an enlarged view of the holes in the typical linear burner of FIG. 1a;

FIGS. 9 and 10 show an alternate arrangement that involves a substantially rectangular prismatic lower portion and a substantially cylindrical upper portion in accordance with certain example embodiments.

DETAILED DESCRIPTION OF EXAMPLE EMBODIMENTS OF THE INVENTION

The combustion deposition techniques of certain example embodiments use thermal energy produced by the combustion of propane or other suitable fuel and air or other oxygen source to facilitate the deposition of a thin film on glass. A chemical reagent and/or precursor may be vaporized in an inert carrier gas stream in a highly controlled manner and may be subsequently inserted directly or indirectly into the oxygen source for the flame. The reagent may be selected such that at least a portion of the reagent is used in forming the coating. As alluded to above, this stream may be mixed with propane or other suitable combustible gas to form a pre-mixed combustion gas stream. Mixing may be achieved using, for example, a Venturi mixer or other suitable technology. This mixture may be fed to a burner and combusted in a linear flame front extending to or beyond the width of the substrate to be coated. The heat of the combustion may cause the thermal decomposition of the precursor and subsequent chemical reactions leading to film growth, directly or indirectly, on the substrate. A combusted material comprising non-vaporized material may be formed via the combusting. In other words, the glass substrate may be provided in an area so that the glass substrate is heated sufficiently to allow the combusted material to form the coating, directly or indirectly, on the glass substrate. The coating may be applied in a substantially uniform manner (e.g., across two dimensions), as measured by variations in thickness of the coating and/or variations in other coating properties (e.g., density, refractive index, etc.).

Total combustion gas flow rate, air (or oxygen) to fuel ratio, precursor concentration, burner-to-glass distance, and substrate temperature are example parameters that may influence the combustion deposition depositing of a material. For example, these parameters may influence film density, composition, microstructure, deposition rate, etc. Film thickness also may be controlled, at least in part, by changing the number of deposition passes or burners, etc.

Certain example embodiments of this invention relate, in particular, to an in-line scalable system that may be used in the combustion deposition depositing of thin films. For instance, certain example embodiments may be used to deposit a silicon oxide (SiOx) diffusion barrier coating.

Figure 1A:
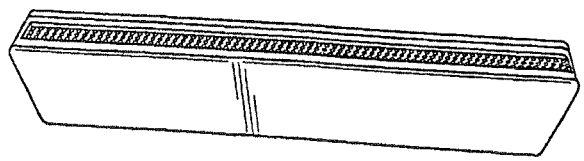
FIG. 1a shows a typical linear burner.
Figure 1B:
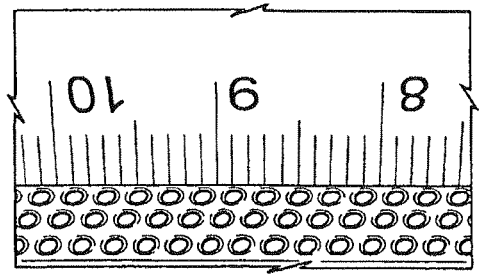
Figure 2:
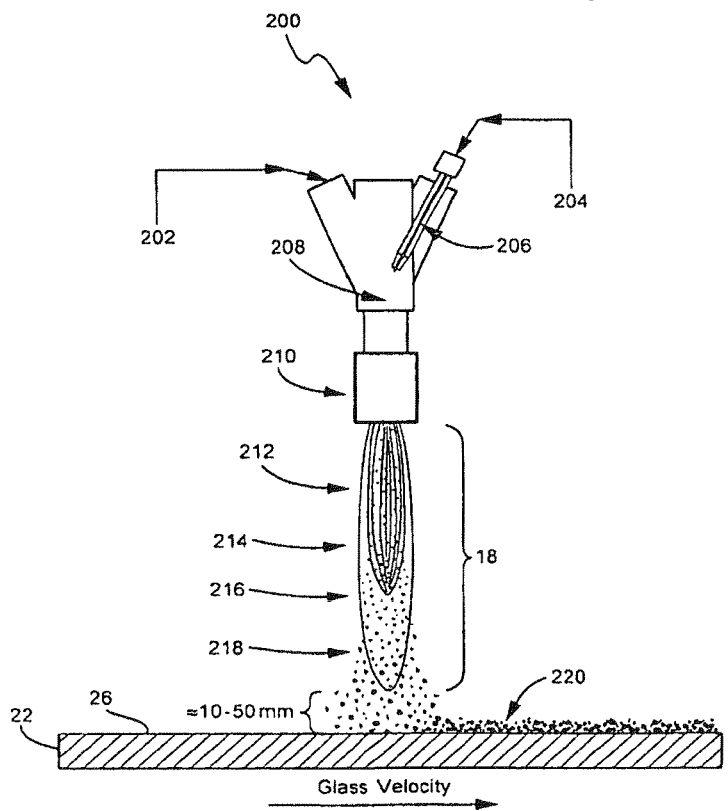
FIG. 2 is a simplified view of an apparatus including a linear burner used to carry out combustion deposition.
Figure 3:
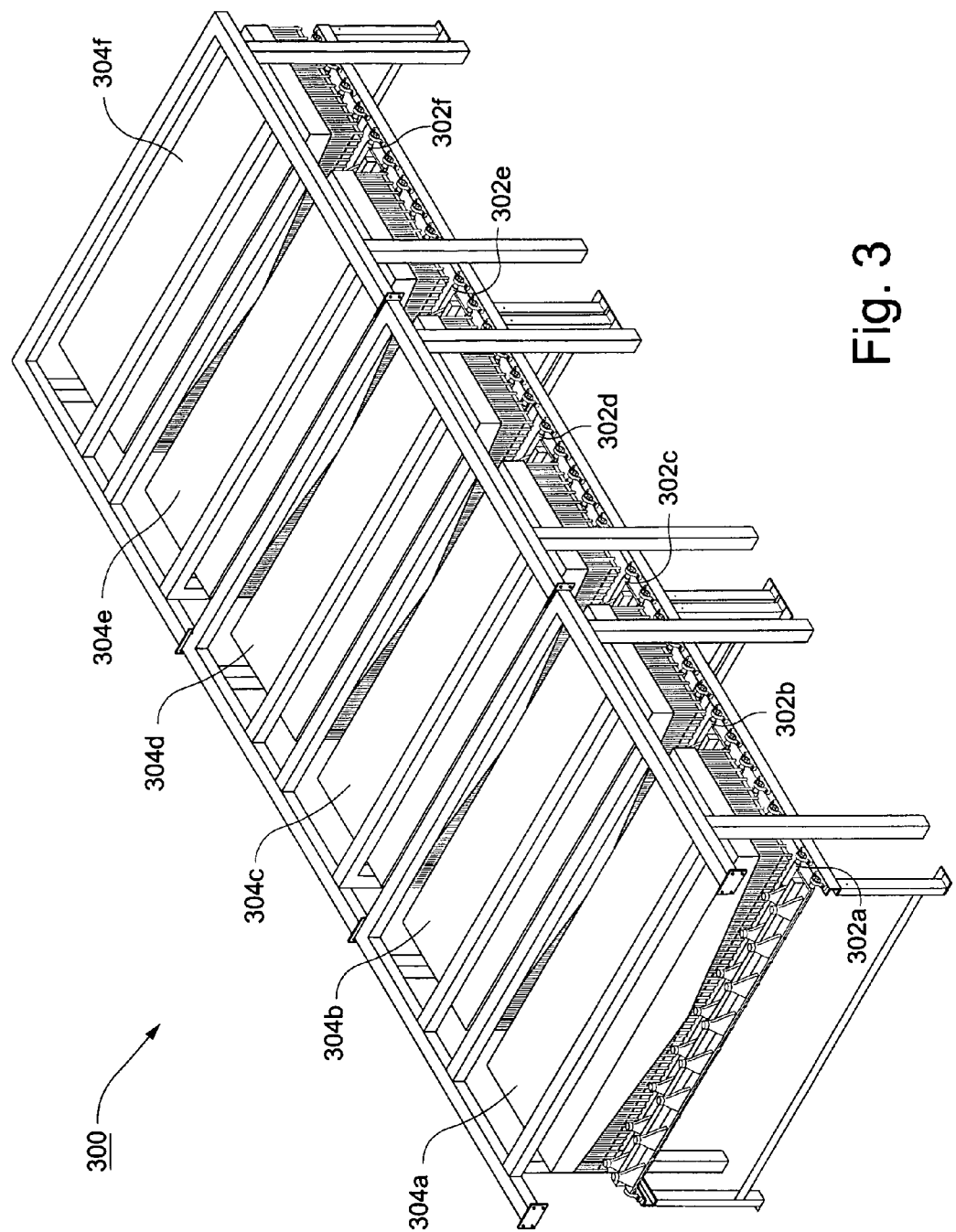
FIG. 3 is a front perspective view of an example in-line combustion deposition system in accordance with certain example embodiments.
Figure 4:
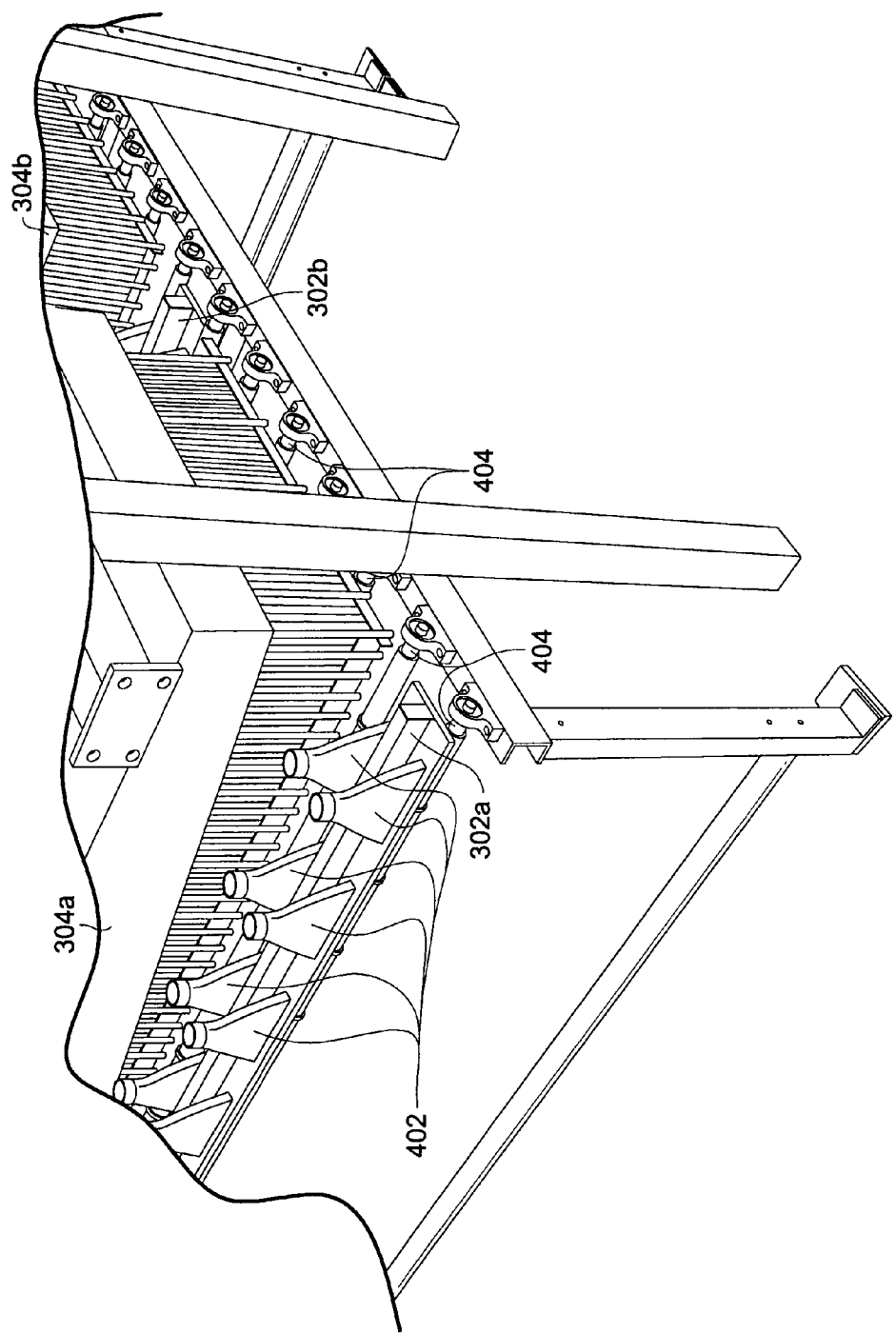
FIG. 4 is an enlarged front perspective view of the example in-line combustion deposition system of FIG. 3.
Figure 5:
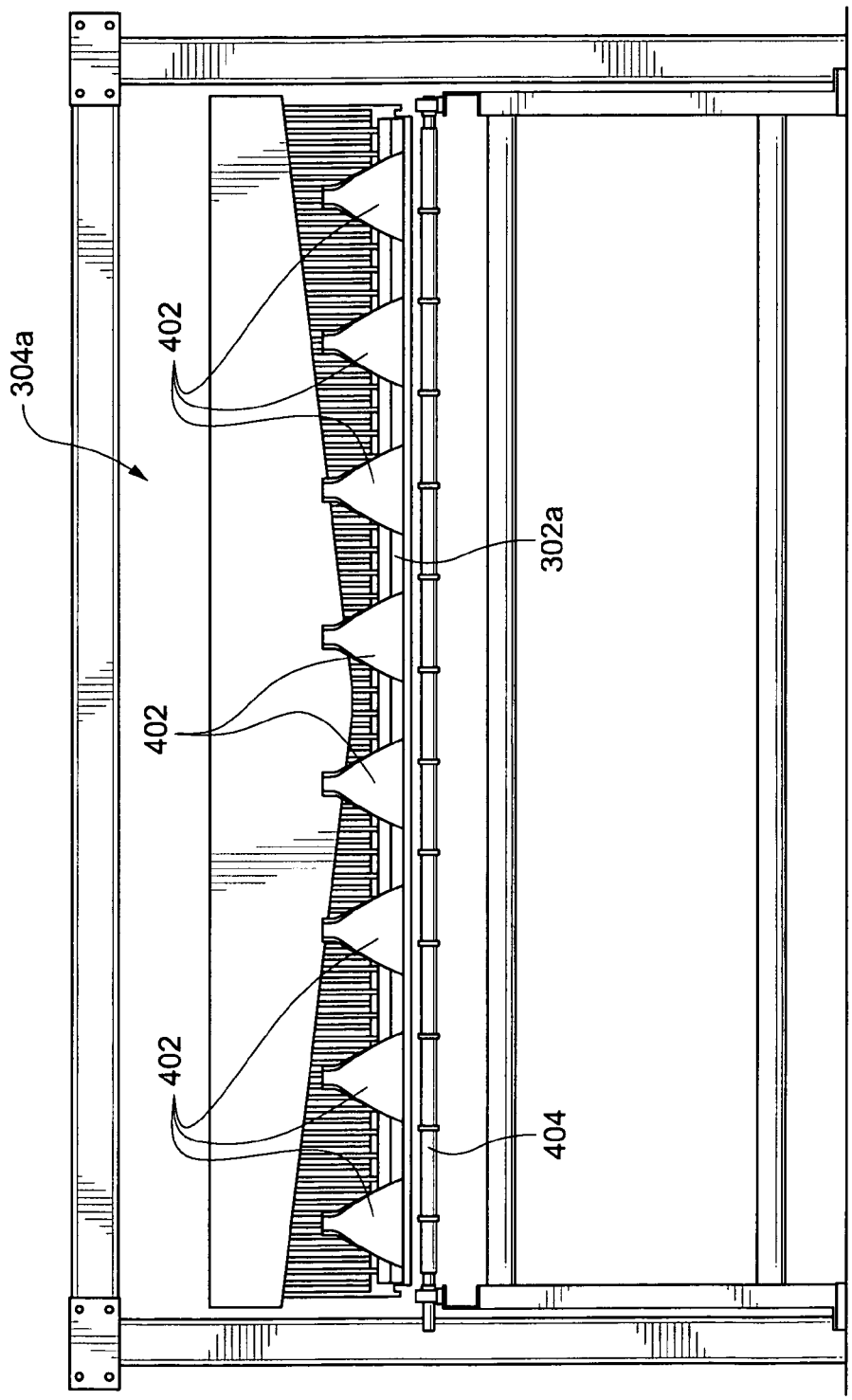
FIG. 5 is a view of the side of the example in-line combustion deposition system of FIG. 3 into which the substrate is fed.
Figure 6:
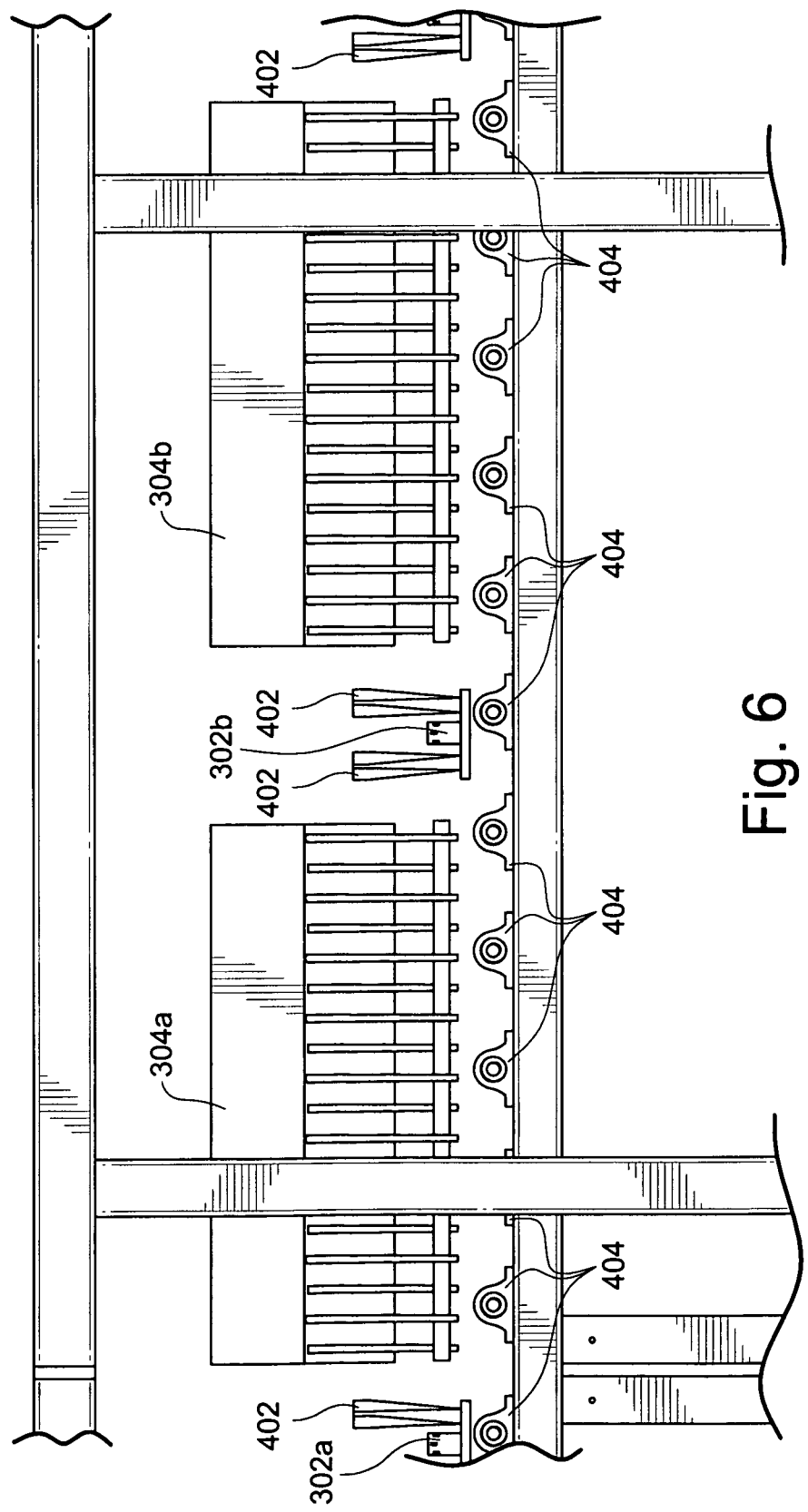
FIG. 6 is an enlarged view of the side of the example in-line combustion deposition system of FIG. 3 that is perpendicular to that shown in FIG. 5.

Referring now more particularly to the drawings, FIGS. 3-6 are views of an in-line combustion deposition system 300 in accordance with certain example embodiments. In particular, FIG. 3 is a front perspective view of an example in-line combustion deposition system 300 in accordance with certain example embodiments; FIG. 4 is an enlarged front perspective view of the example in-line combustion deposition system 300 of FIG. 3; FIG. 5 is a view of the side of the example in-line combustion deposition system 300 of FIG. 3 into which the substrate is fed; and FIG. 6 is an enlarged view of the side of the example in-line combustion deposition system 300 of FIG. 3 that is perpendicular to that shown in FIG. 5. As will be appreciated from FIG. 3, the in-line combustion deposition system 300 shown therein includes six burners 302a-f and six cooling sections 304a-f, provided in alternating order. Of course, more or fewer burners and cooling sections may be provided in different embodiments of this invention, and the burners and cooling sections need not alternate in different embodiments. The in-line combustion deposition system 300 shown in FIG. 3 uses a single burner 302 across the width of the substrate to deposit the coating. The system may feature a modular design. In the FIG. 3 example embodiment, two deposition sections (two burners and two cooling sections) are mounted on a single conveyor section or module, and three conveyor sections or modules are provided. It will be appreciated that the modular design facilitates easy expansion and contraction of the line, which may be useful when depositing different materials, changing production line speeds, accommodating longer substrates, etc. In certain example implementations, each module is 8.5 feet long, meaning that three modules provide a total line length of 25.5 feet. Of course, it will be appreciated that a section may include more or fewer burners and/or cooling sections, that more or fewer total modules may be provided, that each module may be longer or shorter, etc.

As can be seen in FIGS. 3-4, for example, multiple modules may screwed, bolted, or otherwise secured to one another via corresponding features provided to the frames of the modules. It will be appreciated that securing the modules together in this or a similar way may help provide stability of the entire line and promote safe passage of the substrate to be coated/being coated from module-to-module. Additionally, individual modules may be bolted, screwed, or otherwise connected to the floor and/or features on the floor.

In certain example embodiments, deposition parameters such as those described above may be independently controlled. For instance, flow rates of propane, air, liquid precursor, carrier gas, and/or the like may be controlled using mass flow controllers (MFCs), which accurately maintain set point values. Additionally, a PC-based Process Control System (PCS) may be used to control and monitor process parameters in certain example embodiments. The PCS may also contain a stand-alone programmable logic controller (PLC) that may be responsible for the control of flame safeguards, e.g., in accordance with NFPA or other applicable standards, in certain example embodiments. The PCS may in certain example embodiments provide logging features and may be linked to a Coater Data System (CDS) for local or remote monitoring.

Consistent delivery of precursor material may be provided via Brooks Instrument vaporizer systems or the like. These types of systems are advantageous compared to other delivery techniques such as, for example, bubblers, liquid injectors, and nebulizers, as the flow rates of both liquid precursor and carrier gas may be metered directly and independently thereby helping to ensure a high degree of accuracy and precision. These systems can be used with volatile and non-volatile precursors, low vapor pressure materials, solids in solution, etc. They also are compatible with a wide range of viscosities and may be used over relatively larger precursor flow rate ranges. The use of vapor phase delivery techniques also has to potential to reduce complications associated with liquid-based methods including, for example, mixing issues, managing polydisperse drop sizes, the need to design equipment that reduces the likelihood of droplet impaction, residue from droplets impacting and sticking to the walls of the equipment (potentially leading to fouling), etc. Of course, delivery techniques including bubblers, liquid injectors, and nebulizers also may be used in connection with different embodiments of this invention.

To help ensure consistency of the deposited material, the substrate temperature may be maintained at or around a given set point prior to each burner pass. A heater, located after a glass washing machine and before entering the first deposition may be used to achieve the desired initial substrate temperature. High volume cooling air sections, similar to those used on glass tempering lines, may be used to cool the coated surface of the substrate after each deposition location (e.g., each burner location) in certain example embodiments to help control the substrate temperature. The substrate may be cooled only on the side that the deposition is to take place in certain example embodiments (depending, for example, on the thermal conductivity of the substrate and operational line speed). Infrared (IR) thermocouples may be used to monitor the glass temperature and provide feedback to a control loop used to regulate the flow rate of the cooling air. The flow rate of the cooling air may be controlled using a variable frequency drive on the blow motors in certain example instances. The final cooling section may cool the glass from both sides in certain example embodiments, which may help reduce the temperature as quickly as possible and/or desirable. The final section (and/or other sections) may oscillate to provide increased residence time typically needed to cool thicker glass.

Kevlar-covered rollers 404 (shown perhaps best in FIGS. 4 and 6) may be used to transport the substrate and thermally isolate the substrate from the rollers 404 in certain example embodiments. In certain example embodiments, the rollers 404 may be Kevlar-wrapped steel rollers. In certain example embodiments, silica rollers may be provided adjacent to the burners, and the Kevlar-wrapped steel rollers may be provided remote from the burners. As can be seen from FIG. 4, for example, the burners may be provided "between" rollers in certain example embodiments. That is, in certain example embodiments, the rollers may not be provided directly underneath the burners and/or may be located remote from any flames produced by the burners.

Cooling fluids (e.g., water) may be circulated through the side walls of the burners in certain example embodiments to reduce the likelihood of the burners warping at high temperature. The cooling system may use a closed-loop design in certain example embodiments. In addition, or in the alternative, corrosion inhibitors may be used to increase the lifetime of wetted components.

The individual burners may be mounted on a sliding rail system, and may be removed (e.g., perpendicularly to the direction of substrate travel), e.g., to a cart for maintenance and/or other purposes. The burner and baffle height may be independently adjustable.

The combustion byproducts may be exhausted through a single roof penetration in certain example embodiments. Each individual burner 302 and/or baffle manifold system 402 (shown perhaps best in FIGS. 4 and 5) may be routed to this main exhaust duct in certain example embodiments. The system may use a blower to provide negative pressure the burner baffle/exhaust systems 402, and the blower may be sized to accommodate substantially complete evacuation of combustion products in certain example embodiments. Additional blower capacity may permit additional ambient air to be drawn up through the openings in the burner baffle systems 402. This air may be used to help reduce the temperature of the effluent stream to a temperature that can be handled without special high-temperature materials in certain example embodiments. This arrangement also may help ensure that substantially all combustion products are captured by the baffles 402. Butterfly vales or the like also may be used in certain example embodiments to provide an alternate or additional source for ambient air in the event that drawing it all from the baffle zone negatively or unexpectedly affects the deposition. As will be appreciated from FIGS. 4 and 5, for example, multiple individual baffle/exhaust systems 402 may be provide on opposing sides of an individual burner 302. Further details are provided below regarding the example structure and example function of the baffle/exhaust systems 402 of certain example embodiments. In certain example embodiments, one, or a plurality of, vents may be provided alongside each burner depending, for example, on the burner length. In certain example embodiments, two, three, or more vents may be provided alongside each burner.

Example Cooling Systems

Further details of the cooling system of certain example embodiments will now be provided. As indicated above, a cooling section 304 may be located after each burner 302. Each cooling section 304 may have a designated VFD (variable frequency drive) driven blower. The blower itself may be a close-looped control mechanism and may have a PLC/pyrometer to measure glass temperature and help ensure proper cooling prior to a substrate passing beneath the next burner. The motor and blower may be mounted above their respective cooling section in certain example embodiments. Each blower, in turn, may include an air intake filter system. The filter system may be sized appropriately for the air volume required and may be accessible and easily removable (e.g., from the top of the assembly).

The cooling section may be designed to reduce the amount of airflow towards the burners, as air disturbance of the flame may have a negative effect on the quality and uniformity of the coating. Accordingly, the cooling sections may be provided with an adjustable baffle on one or both ends thereof. It will be appreciated that adjustability advantageously may allow for process tuning and varying glass thickness. Indeed, it will be appreciated that achieving the same or substantially the same start temperature for each burner pass would be advantageous (and often is beneficial when depositing homogenous films). For example, doing so may help in terms of deposition rate, film growth, coating roughness, coating density, index of refraction, etc. In any event, the adjustable baffle may be about 3 mm from surface of the substrate in certain example embodiments. Further details of adjustable baffles in accordance with certain example embodiments will be provided below.

The cooling section design may include an angled bottom profile, e.g., as shown perhaps best in FIG. 5. Given this design, the air may be more likely to escape from the sides than being forced towards one of the burners. An active solution may be provided in certain example embodiments, e.g., by ducting some of the blower intake from before and after each respective cooling section. This may help to capture air currents and reduce the likelihood of them reaching the burner.

The dimensions of each cooling section may vary, e.g., based on the cooling time necessary for moving at a particular speed, etc. This calculation also may take into account the maximum glass thickness that can be cooled given these parameters. In certain example implementations, each cooling section may be 915 mm in length, and the line speed may be approximately 4 m/min. In certain example implementations, for 10 mm glass, a line speed of 3 m/min may be needed to cool the glass from 130 degrees C. to 100 degrees C. As indicated above, the last cooling section may be of a higher capacity, e.g., it may be capable of cooling the glass to about 70 degrees C. for handling purposes. This may, in certain example embodiments, require additional cooling sections, as conveyor speed may not be capable of being decreased in certain example implementations. Of course, in certain example implementations, cooling may be provided from underneath the substrate at the end cooling section (and/or at other sections), e.g., so as to keep the line length short. This end section also may be capable of providing this cooling for the maximum glass thickness specified for the 4 m/min line speed.

Figure 7:
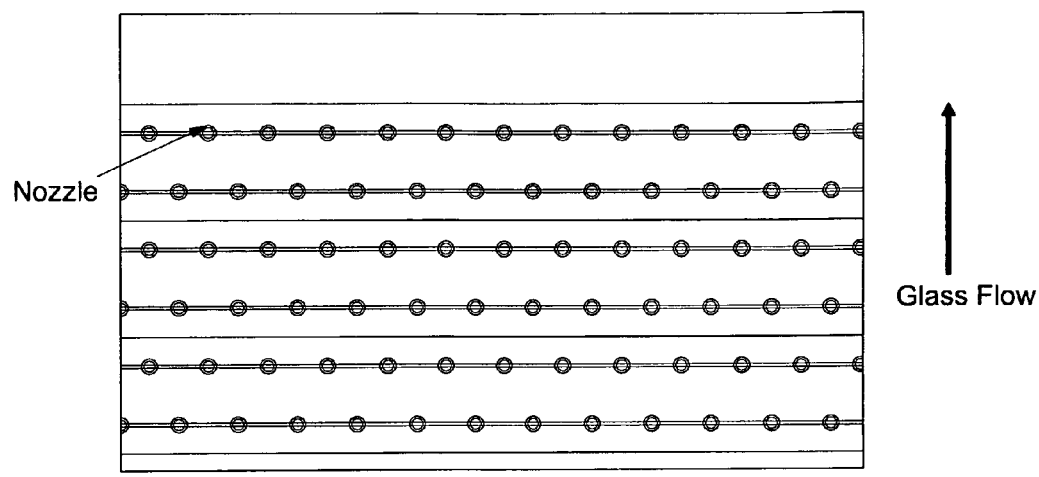
FIG. 7 is an example nozzle configuration suitable for use with cooling sections of certain example embodiments.

FIG. 7 is an example nozzle configuration suitable for use with cooling sections of certain example embodiments. As shown in FIG. 7, the nozzles may be spaced apart and offset from one another or staggered, e.g., in the direction of glass flow. In certain example embodiments, the nozzles may be spaced 50 mm from each other. As also shown in FIG. 7, the nozzles may be connected to one another to maintain substantial perpendicularity to the glass. In certain example embodiments, the face of the nozzles may be about 50 mm from the surface of the nominal thickness of the substrate, although entire cooling section may be adjustable in height (e.g., so that the nozzles range from about 25 mm to about 100 mm in distance from the nominal thickness of the substrate). In certain example embodiments, the blower may provide at least about 254 mm (about 10") of water column at each nozzle in the array in certain example embodiments. The air nozzles may be substantially circular in certain example embodiments and may have an internal diameter or distance of about 10 mm. Of course, other shapes and/or sizes also are possible in connection with different embodiments of this invention. The entire system or the cooling sections may be rated at or below 80 dbA at a distance of 1.0 m from the machine and 1.5 m above the floor in certain example implementations.

Example Flame Guard and Exhaust Systems

Certain example embodiments also relate to a combined flame guard and exhaust system for the deposition of materials (e.g., metal and metal oxide coatings) via combustion deposition. The combined flame guard and exhaust system of certain example embodiments advantageously may provide a means to reduce the amount of interference of the deposition process by ambient conditions, improve flame uniformity in the deposition zone, contain and exhaust combustion products while reducing restrictions to the stable operating space of the combustion deposition process, etc.

The implementation of a large-area combustion deposition coater may involve consideration of several factors. First, the combustion products produced by the flame may be contained to reduce the likelihood of exposure of plant personnel in the area. An exhaust mechanism may be used to help accomplish this. Furthermore, it will be appreciated that it would be advantageous to make this mechanism small, e.g., to reduce the overall process footprint. Furthermore, a modular, scalable design lends itself well to expansion and/or modifications to the coating line.

It is also would be advantageous to provide protection of the deposition zone from external influences including, for example, air currents induced by the ambient environment, forced air if convective cooling of the substrate is used, etc. A device that permits the substrate to pass through the system unimpeded, but is in sufficiently close contact to reduce the flow of air into the area, may be provided to accomplish this in certain example embodiments. Active flow control, by means of, for example, an air purge or vacuum system, also is advantageous. Indeed, reducing the amount of interference from outside air currents may improve flame uniformity in large area coating applications. Additionally, reducing the amount of material flowing towards the flame may, in turn, reduce the amount of contamination in the film.

It also would be advantageous to provide a device that does not substantially interfere with the deposition process or significantly restrict the stable operating space.

The combined flame guard and exhaust system of certain example embodiments addresses some or all of these design considerations, offering advantages in terms of a small footprint, linear scalability, vertical adjustability to permit variations in the burner-to-glass distance, etc.

Figure 8:
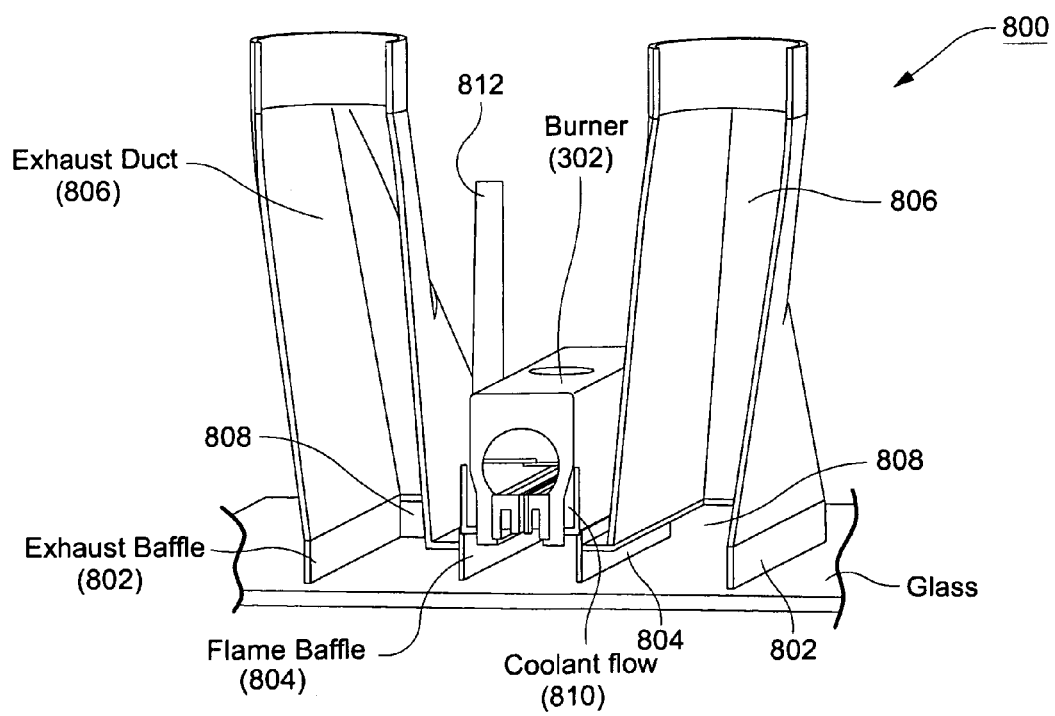
FIG. 8 is a cross-sectional view of a combined flame guard and exhaust system 800 in accordance with an example embodiment.

Referring once again to the drawings, FIG. 8 is a cross-sectional view of a combined flame guard and exhaust system 800 in accordance with an example embodiment. Each combined flame guard and exhaust system 800 comprises an external baffle 802 and an internal baffle 804. The external baffle 802 is sized and positioned to help restrict air flow into the deposition area and helps serve as the outer wall of the exhaust manifold or exhaust duct 806. The external baffle 802 therefore may be sometimes referred to as an exhaust baffle. The internal baffle 804 helps confine the deposition zone to the area immediately under the burner face and also helps provide a second wall of the exhaust manifold or exhaust duct 806. The internal baffle 804 therefore may be sometimes referred to as a flame baffle. At each end of the burner 302 is a wall 808 that helps serve to join the outer baffle 802 and complete the exhaust manifold. The combined flame guard and exhaust system 800 may be adjusted vertically by any suitable mechanical, electrical, or pneumatic means. Optionally, the inner baffle 804 may be adjusted independently of the outer baffle 802, e.g., to help optimize deposition conditions. The exhaust ductwork 806 and the entire assembly also may be insulated in certain example embodiments to reduce heat transfer to the surrounding area. As alluded to above, cooling may be provided to the burner 302 and/or baffle system 800 to reduce the likelihood of warping, e.g., by virtue of a coolant flow manifold system 810 received, for example, from pipe 812, which may be located in front of, behind, to the side, or in other relation to the burner 302.

A substantially planar boundary may be provided at the lower opening of the baffle, e.g., substantially perpendicular to the inner and outer walls 802 and 804, to help provide containment of the combustion products. This boundary can be a sheet of glass in certain example embodiments. A permanent boundary also may be placed slightly below the plane of glass travel to provide exhaust containment when there is no glass passing underneath the assembly.

A negative pressure may be supplied to the exhaust duct 806 to help draw combustion products up around the inner baffle 804 towards an exhaust port by means of, for example, an air blower. The flow rate of this blower may be equal to or greater than the flow rate of the combustion products in certain example embodiments. Advantageously, this blower may pull additional air from the surroundings into the exhaust port. This technique may be used as an active means of flow control, e.g., by creating a gaseous current substantially perpendicular to the direction of glass travel and upward towards the exhaust port. This, in turn, may further isolate the flame from external air currents. Additionally, diluting the exhaust gas stream with ambient air may help cool the exhaust system. The exhaust stream also may serve to carry away flakes and particles that tend to accumulate in the deposition area (e.g., silica flakes when a SiOx layer is being deposited). In certain example embodiments, the outer baffle may be spaced a few millimeters from the wall, and/or the inner baffle may be slightly higher (e.g., 2 mm higher) than the outer baffle to reduce the amount of pressure buildup inside of the deposition zone.

It will be appreciated that the ducts of certain example embodiments may be provided according to any suitable geometry. For instance, the ducts may be substantially rectangular, triangular, prism, cone, or other shaped, and/or may involve multiple portions of these and/or other shapes alone or in various combinations. For example, the geometries of the ducts shown in FIGS. 1-8 have lower portions that are substantially triangular prismatic in construction and upper portions that are substantially cylindrical in construction. FIGS. 9 and 10 show an alternate arrangement that involves a substantially rectangular prismatic lower portion and a substantially cylindrical upper portion in accordance with certain example embodiments. Example dimensions of the burner and baffle assembly also are provided in FIGS. 9 and 10, although other dimensions are of course possible in different embodiments of this invention.

The example baffle configuration described above was tested and shown to protect the flame from external air currents. Air knives were run under a hood adjacent to the burner, while a large piece of steel was placed under both sections. This trial helped simulate the effect of a strong breeze or convective cooling air coming across a glass surface. No interference of the flame was detected. The internal baffle was very effective at confining the flame contact area. Outside of the inner baffle, the flame was observed to curve upward toward the exhaust port.

The stable operating space of the flame was examined both with and without the baffle. The operating space was shown to be nearly identical both with and without the baffle. Therefore, it has been shown that the system does not restrict the stable operating space of the deposition process.

Emissions testing was performed to verify the containment of combustion products. The system was shown to be very effective at containing and exhausting combustion productions. Concentrations of CO were less than 1 ppm and NOx in the ambient air was found to be less than 2 ppm. The system performance was maintained, even when significant air flows were introduced around the assembly.

It is believed that the signal for NOx was an artifact of ambient conditions or instrument noise (due to instrument detection limits). Indeed, the ambient building air was tested and produced a reading 0-2 ppm of NOx in an area removed from where the process was evaluated. Accordingly, containment of NOx may actually have been better than that which was shown during the testing.

The combined flame guard and exhaust system of certain example embodiments are advantageous for a number of reasons. For example, the combined flame guard and exhaust system may help isolate the deposition flame from ambient conditions, thereby helping improve flame uniformity and reducing heat transfer to the surrounding area. This also may reduce the amount of contaminants in the coating, while providing limited negative impact on the deposition process, e.g., because of the ability to alter and/or optimize the deposition process and/or the deposition process conditions. It also is advantageous in terms of helping to contain exhaust combustion products. The combined flame guard and exhaust system of certain example embodiments has a small footprint and, when combined with the large-area systems described above, is linearly scalable. Still further example advantages may relate to improved deposition uniformity over a large area, resulting in improved coating uniformity (e.g., in connection with 2.54 m system), reduced heat transfer to the glass from the flame as achieved by reducing the contact area of the flame with the glass, etc.

It will be appreciated that the burners used in connection with example embodiments of this invention may be linear combustion deposition burners, e.g., of the type commercially available from Webber (such as a ribbon burner) or Innovent. Infrared (IR) burners also may be used in connection with different example embodiments of this invention. In certain example embodiments, linear and/or infrared burners may be used together or separately among and/or between the different modules.

It will be appreciated that while a layer or coating is "on" or "supported by" a substrate (directly or indirectly), other layer(s) may be provided therebetween. Thus, for example, a coating may be considered "on" and "supported by" the substrate even if other layer(s) are provided between the growth and the substrate. Moreover, certain growths or layers of a coating may be removed in certain embodiments, while others may be added in other embodiments of this invention without departing from the overall spirit of certain embodiments of this invention.

It will be appreciated that the techniques described herein can be applied to a variety of metals and metal oxides, and that the present invention is not limited to any particular type of metal/metal oxide deposition and/or precursor. For example, oxides of the transition metals and lanthanides such as, for example, Y, Ti, Zr, Hf, V, Nb, Ta, Cr, Mo, W, La, Ce, Cr, Mo, W, Mn, Fe, Ru, Co, Ir, Ni, Cu, and main group metals and metalloids such as, for example, Zn, Cd, B, Al, Ga, In, Si, Ge, Sn, Sb and Bi, and mixtures thereof can all be deposited using the techniques of certain example embodiments. As another example, metallic silver and tin may also be deposited using the techniques described herein.

It will be appreciated that the foregoing list is provided by way of example. For example, the metal oxides identified above are provided by way of example. Any suitable stoichiometry similar to the metal oxides identified above may be produced. Additionally, other metal oxides may be deposited, other precursors may be used in connection with these and/or other metal oxide depositions, the precursor delivery techniques may be altered, and/or that other potential uses of such coatings may be possible. Still further, the same or different precursors may be used to deposit the same or different metal oxides for a metal oxide matrix coating and/or embedded nano-particles.

Also, it will be appreciated that the techniques of the example embodiments described herein may be applied to a variety of products. That is, a variety of products potentially may use the AR films alluded (e.g., using the same or different process conditions) to above and/or other AR films, depending in part on the level of transmission gain that is obtained. Such potential products include, for example, photovoltaic, green house, sports and roadway lighting, fireplace and oven doors, picture frame glass, etc. Non-AR products also may be produced. For example, $TiO_2$ films may be deposited or heat treated to produce the anatase crystalline phase, which typically is photocatalytic and may be used, for instance, in "low maintenance glass" product and/or applications.

The example embodiments described herein may be used in connection with other types of multiple layer (e.g., multi-layer AR) coatings, as well. By way of example and without limitation, multiple reagents and/or precursors may be selected to provide coatings comprising multiple layers.

The techniques described herein also may be combined with the techniques disclosed in one or more of application Ser. Nos. 11/979,543; 12/000,784; 12/071,162; 12/076,100; 12/076,101; 12/149,396; 12/155,762; 12/213,008; and 12/591,168, the entire contents of each of which are hereby incorporated herein by reference.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:
1. A flame guard and exhaust system for use in a combustion deposition depositing system for forming a coating on a substrate via at least one flame of at least one burner, the flame guard and exhaust system comprising:
an external baffle;

an internal baffle spaced apart from the external baffle, the internal baffle to be closer than the external baffle to the at least one burner;
an exhaust duct located over the external and internal baffle;
first and second walls to be respectively provided at opposing ends of the at least one burner and joining the external baffle to the internal baffle so as to form a continuous boundary of the exhaust duct such that air that flows into the duct must pass between the external baffle and internal baffle,
wherein the external baffle is sized and positioned to (1) reduce an amount of air flow into a deposition area proximate to the at least one flame during operation of the combustion deposition depositing system and (2) serve as a most external wall of the exhaust duct,
wherein the internal baffle is sized and positioned to (1) at least partially confine the deposition area to the area immediately under the at least one burner face during operation of the combustion deposition depositing system and (2) provide an internal wall of the exhaust duct;
a mechanical, electrical, and/or pneumatic system to vertically adjust the flame guard and exhaust system; and
wherein the internal and external baffles are height adjustable independent of one another.

2. The flame guard and exhaust system of claim 1, wherein the internal baffle is shorter than the external baffle such that a bottom surface of the internal baffle is located farther away from the substrate than a bottom surface of the external baffle when the substrate is located under the flame guard and exhaust system.

3. The flame guard and exhaust system of claim 1, wherein each side of the external baffle is spaced apart from the first and second walls.

4. The flame guard and exhaust system of claim 1, further comprising a blower configured to generate a supply of negative pressure to the exhaust duct.

5. The flame guard and exhaust system of claim 1, further comprising a substantially planar boundary provided at a lower opening of the flame guard and exhaust system, the substantially planar boundary being substantially perpendicular to the internal and external baffles.

6. A flame guard and exhaust system for use in a combustion deposition depositing system for forming a coating on a substrate via at least one flame of at least one burner, the flame guard and exhaust system comprising:
an external baffle;
an internal baffle spaced apart from the external baffle, the internal baffle to be closer than the external baffle to the at least one burner;
an exhaust duct located over the external and internal baffle;
first and second walls to be respectively provided at opposing ends of the at least one burner and joining the external baffle to the internal baffle so as to form a continuous boundary of the exhaust duct such that air that flows into the duct must pass between the external baffle and internal baffle,
wherein the external baffle is sized and positioned to (1) reduce an amount of air flow into a deposition area proximate to the at least one flame during operation of the combustion deposition depositing system and (2) serve as a most external wall of the exhaust duct,
wherein the internal baffle is sized and positioned to (1) at least partially confine the deposition area to the area immediately under the at least one burner face during operation of the combustion deposition depositing system and (2) provide an internal wall of the exhaust duct; and
insulation provided to the exhaust duct and/or the flame guard and exhaust system in its entirety.

7. The flame guard and exhaust system of claim 6, further comprising a mechanical, electrical, and/or pneumatic system to vertically adjust the flame guard and exhaust system.

8. The flame guard and exhaust system of claim 7, wherein the internal and external baffles are height adjustable independent of one another.

9. A combustion deposition apparatus for use in combustion deposition depositing a coating on a substrate, comprising:
a burner configured to create a flame in an area between the burner and the substrate, the burner being sized such that it extends at least along the entire length of the substrate; and
a plurality of flame guard and exhaust systems, each said flame guard and exhaust system comprising:
an external baffle;
an internal baffle spaced apart from the external baffle, the internal baffle being closer than the external baffle to the burner;
an exhaust duct located over the external and internal baffle; and
first and second walls to be respectively provided at opposing ends of the burner and joining the external baffle to the internal baffle so as to form a continuous boundary of the exhaust duct such that air that flows into the exhaust duct must pass between the external baffle and the internal baffle,
wherein the external baffle is sized and positioned to (1) reduce an amount of air flow into a deposition area proximate to the at least one flame during operation of the combustion deposition depositing system and (2) serve as a most external wall of the exhaust duct, and
wherein the internal baffle is sized and positioned to (1) at least partially confine the deposition area to the area immediately under the burner face during operation of the combustion deposition depositing system and (2) provide an internal wall of the exhaust duct,
wherein, in operation, the flame causes precursor material to be combusted and heats the substrate to allow at least a portion of the combusted precursor material to form the coating, directly or indirectly, on the substrate,
wherein the flame guard and exhaust systems are provided on opposing sides of the burner.

10. The apparatus of claim 9, wherein at least two flame guard and exhaust systems are provided on each side of the burner.

11. The apparatus of claim 9, wherein each the internal baffle is shorter than the external baffle such that a bottom surface of the internal baffle is located farther away from the substrate than a bottom surface of the external baffle when the substrate is located under the flame guard and exhaust system.

12. The apparatus of claim 9, wherein each side of the external baffle is spaced apart from the first and second walls.

13. The apparatus of claim 9, further comprising a mechanical, electrical, and/or pneumatic system to vertically adjust the flame guard and exhaust system.

14. The apparatus of claim 13, wherein the internal and external baffles are height adjustable independent of one another.

15. The apparatus of claim 9, further comprising insulation provided to the exhaust duct and/or the flame guard and exhaust system in its entirety.

16. The apparatus of claim 9, further comprising a blower configured to generate a supply of negative pressure to the exhaust duct.

17. The apparatus of claim 9, further comprising a substantially planar boundary provided at a lower opening of the flame guard and exhaust system, the substantially planar boundary being substantially perpendicular to the internal and external baffles.

* * * * *